United States Patent
Pellen

(10) Patent No.: US 8,421,393 B2
(45) Date of Patent: Apr. 16, 2013

(54) SYSTEM AND METHOD FOR PULSE EDGE SYNCHRONIZATION

(75) Inventor: Alain T. Pellen, Boca Raton, FL (US)

(73) Assignee: Lockheed Martin Corporation, Bethesda, MD (US)

( * ) Notice: Subject to any disclaimer, the term of this patent is extended or adjusted under 35 U.S.C. 154(b) by 714 days.

(21) Appl. No.: 12/246,239

(22) Filed: Oct. 6, 2008

(65) Prior Publication Data
US 2009/0167376 A1 Jul. 2, 2009

Related U.S. Application Data

(60) Provisional application No. 60/999,650, filed on Oct. 19, 2007.

(51) Int. Cl.
*G05B 11/28* (2006.01)
(52) U.S. Cl.
USPC .......................................... 318/599; 318/112
(58) Field of Classification Search .................. 318/599, 318/811, 34, 41, 705, 112, 49, 85
See application file for complete search history.

(56) References Cited

U.S. PATENT DOCUMENTS

| | | | | |
|---|---|---|---|---|
| 4,625,156 A * | 11/1986 | Komiya et al. | ................. | 318/85 |
| 5,237,250 A * | 8/1993 | Zeile et al. | .................... | 318/562 |
| 6,344,719 B2 * | 2/2002 | Shibazaki et al. | ............. | 318/34 |
| 6,583,591 B2 * | 6/2003 | Echols et al. | .................. | 318/112 |
| 6,734,644 B2 * | 5/2004 | Kaneko et al. | .................. | 318/85 |
| 6,815,920 B2 * | 11/2004 | Cohen et al. | .................. | 318/599 |
| 6,891,342 B2 * | 5/2005 | Nakamura et al. | ............. | 318/77 |
| 7,145,300 B2 * | 12/2006 | Takahashi | ....................... | 318/53 |
| 2006/0158140 A1* | 7/2006 | Furuki | ............................ | 318/68 |
| 2007/0013325 A1* | 1/2007 | Kiuchi et al. | ................... | 318/34 |
| 2008/0218103 A1* | 9/2008 | Nakamura | ...................... | 318/85 |

* cited by examiner

*Primary Examiner* — Rina Duda
(74) *Attorney, Agent, or Firm* — Kevin D. Jablonski; Graybeal Jackson LLP

(57) ABSTRACT

A system and method for pulse edge synchronization. According to an embodiment, a first series of PWM signals that may drive a first device wherein each pulse in this series has a rising edge and a falling edge. The system and method further includes a second series of PWM signals that may drive a second device wherein each pulse in the second series of pulses also has a rising edge and a falling edge. These series of pulses are then synchronized such that each rising edge in the first series occurs simultaneous to a falling edge in the second series and vice versa. Such a system and method reduces the level of acoustic noise generated between the two motors. Further, synchronizing the rising and falling edges of the PWM pulses reduces and often eliminates stray EMI.

16 Claims, 4 Drawing Sheets

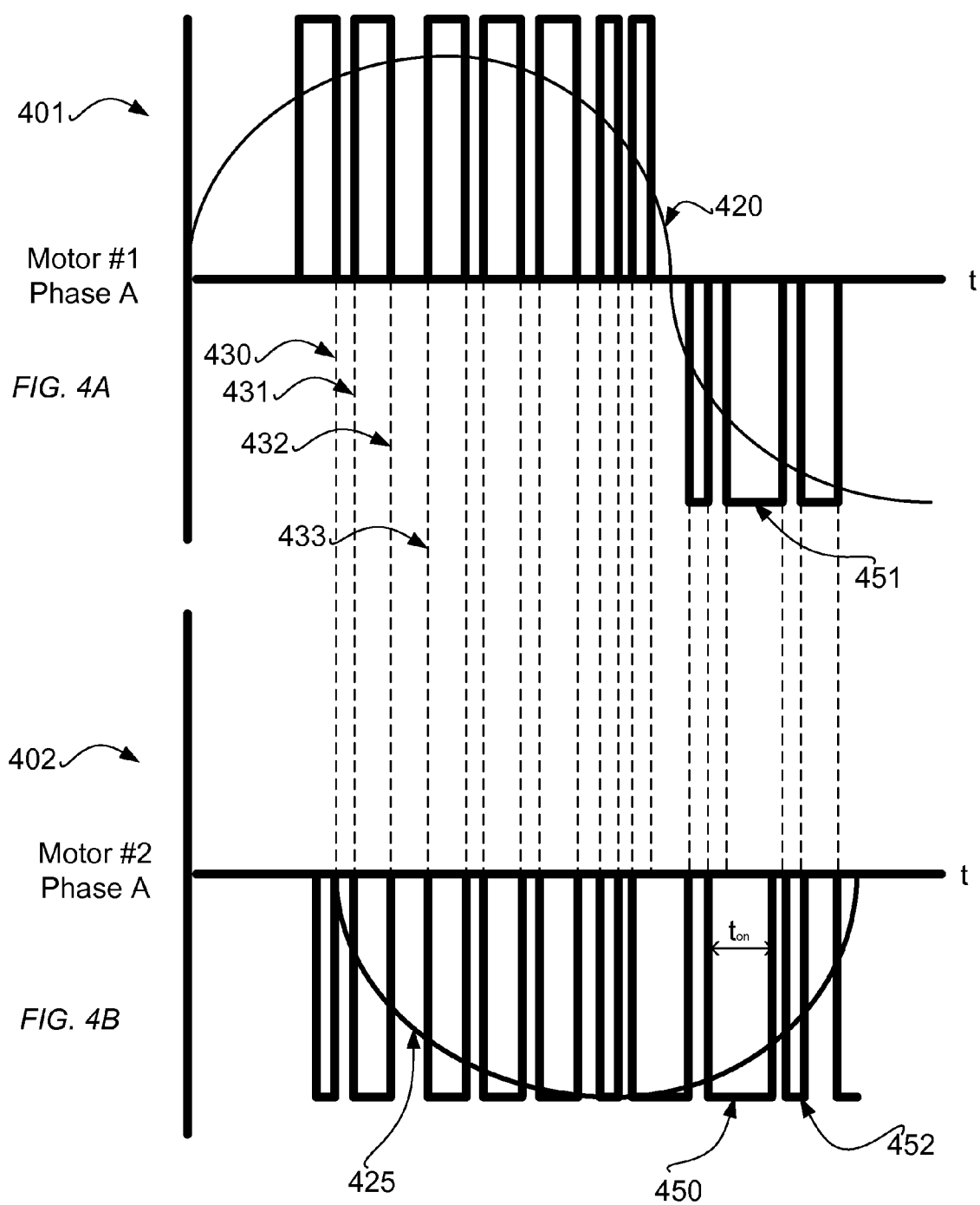

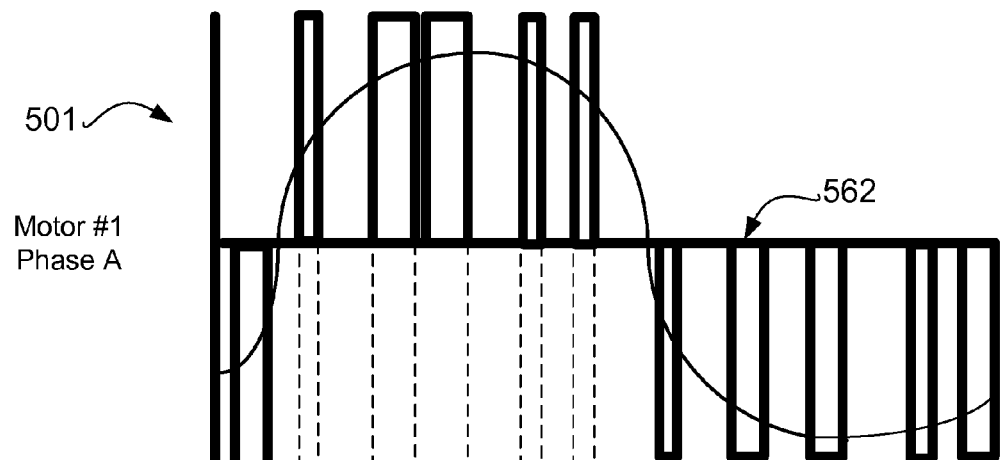
FIG. 5A  Motor #1 Phase A
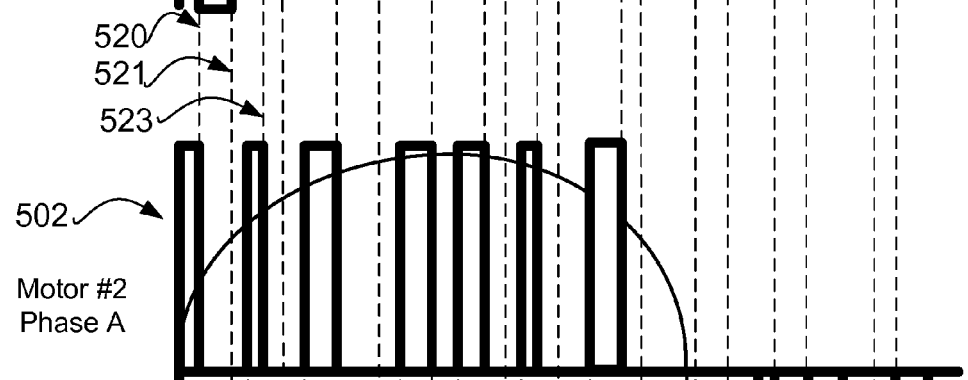
FIG. 5B  Motor #2 Phase A
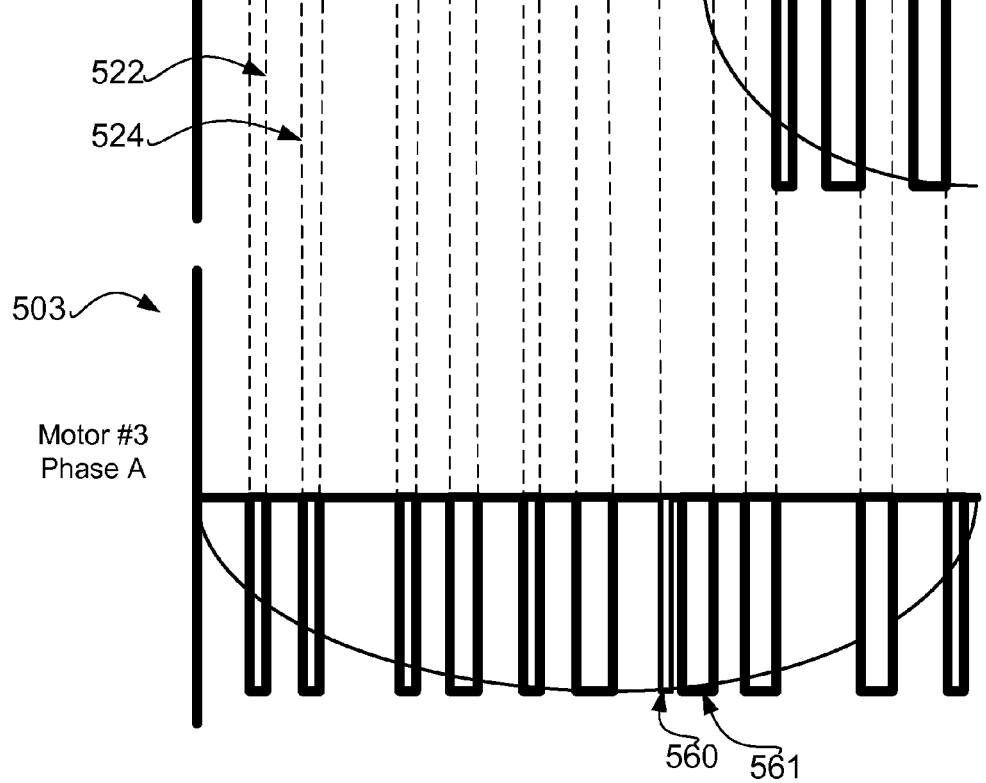
FIG. 5C  Motor #3 Phase A

SYSTEM AND METHOD FOR PULSE EDGE SYNCHRONIZATION

PRIORITY CLAIM

This patent application claims priority from a related U.S. Provisional Patent Application No. 60/999,650 entitled 'PULSE EDGE SYNCHRONIZATION' filed on Oct. 19, 2007 which is incorporated herein in its entirety.

BACKGROUND

Remotely Operated Vehicles (ROV) such as an unmanned submarine vessel or an unmanned aircraft drone may rely on Direct Current (DC) motors for physical motivation and maneuvering. DC motors may be driven from a DC power source such as a battery.

One such DC motor than provides power sufficient for such operations is a brushless DC motor. Brushless DC motors often use Pulse Width Modulation (PWM) techniques to generate multi-phase (e.g., three-phase) electrical power into the windings of a motor to produce a rotating magnetic field. Other apparatuses like switching power supplies may also use PWM or other switching techniques to generate a regulated output voltage. As a result, an ROV may be equipped with one or more brushless DC motors and/or power supplies that are each driven by a set of multiple (e.g., three) PWM signals generated by a controller for the drive system.

PWM and other switching techniques typically use solid state switching devices such as MOSFET transistors or IGBT transistors. The fast rising and falling edges of pulses from such devices may generate sequences of pulses (e.g., one sequence per phase per motor) with such polarity, amplitude, and duration so as to drive each respective brushless DC motor coil with a specified current waveform, e.g., a sinusoidal current.

However, the very nature of pulses generated from a PWM technique may generate undesirable acoustic noise and electro magnetic interference (EMI) that may be electronically or audibly detected or may interfere with the operation of other circuits that are near the pulse source. For example, a sonar array from a nearby hostile vessel may be able to detect the audible acoustic signature, or an antenna may be able to detect an electronic EMI signature. Similarly, the pulse-induced EMI may cause signal interference on e.g., a microchip, a cell phone, or a radio operated in the vicinity of a PWM-driven, brushless DC motor or switching power supply.

Furthermore, because such EMI may be periodic or predictable in time due to the repeating nature of the pattern of pulses, it may provide a periodic EMI signature that may be detected from a remote location and that may be used to identify the device generating the signature. Yet another negative effect of the PWM technique is the acoustic signature that may be caused by the high speed switching devices. This acoustic signature may be radiated out and be detected or otherwise may interfere with other acoustically sensitive devices in air or in water.

BRIEF DESCRIPTION OF THE DRAWINGS

Aspects and advantages of the subject matter disclosed herein will become more readily appreciated as the same become better understood by reference to the following non-limiting detailed description, when taken in conjunction with the accompanying drawings, wherein:

FIGS. 4A-B includes plots of two series of pulses for driving phases of two or more devices using a PWM technique according to an embodiment of the subject matter disclosed herein; and FIGS. 5A-C includes plots of three series of pulses for driving phases of three or more devices using a PWM technique according to an embodiment of the subject matter disclosed herein.

DETAILED DESCRIPTION

The following discussion is presented to enable a person skilled in the art to make and use the subject matter disclosed herein. The general principles described may be applied to embodiments and applications other than those detailed above without departing from the spirit and scope of the subject matter disclosed herein. This disclosure is not intended to be limited to the embodiments shown, but is to be accorded the widest scope consistent with the principles and features disclosed or suggested.

By way of overview, an embodiment of the subject matter disclosed herein is described in the following paragraphs. One embodiment comprises a system and method for driving a first device, such as a brushless DC motor, with a first series of pulses, each pulse in this series having a rising edge and a falling edge. The system and method further include driving a second device with a second series of pulses, each pulse in the second series of pulses also having a rising edge and a falling edge. These series of pulses are then synchronized such that each rising edge in the first series occurs substantially simultaneous with a falling edge in the second series and vice versa.

Such a system and method may provide several advantages over the prior art. First, as pulses in a PWM driven motor tend to generate acoustic noise, the synchronization of the PWM pulses may reduce or eliminate the level of acoustic noise generated by the two motors. Further, the PWM pulses also generate EMI. Synchronizing the rising and falling edges of the PWM pulses may reduce or eliminate stray EMI. Such reductions are accomplished as the acoustic noise and/or EMI from each source effectively cancels each other out when they occur substantially simultaneously. These and other advantages will become evident with respect to the following detailed descriptions.

Figure 1:
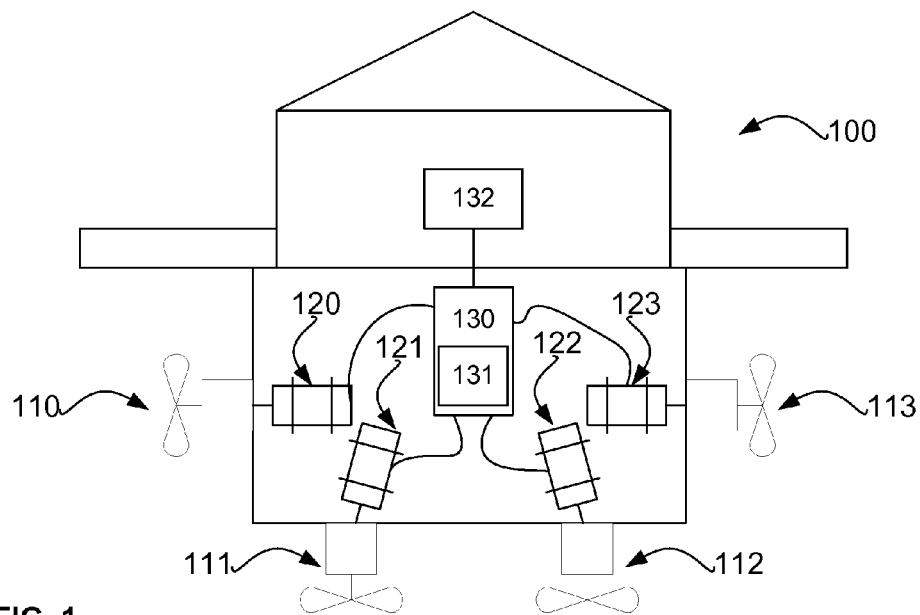
FIG. 1 is a diagram of a remotely operated vehicle having several motors disposed therein for providing motion and maneuvering to the remote-operated vehicle according to an embodiment of the subject matter disclosed herein.

FIG. 1 shows a diagram of a remotely operated vehicle (ROV) 100 having several motors 120-123 disposed therein for providing motion and maneuvering to the ROV 100 according to an embodiment of the subject matter disclosed herein. In this ROV 100, there is shown four separate motors 120-123, each of which corresponds to its own propulsion device 110-113 (e.g., a propeller). Thus, a first motor 120 corresponds to a first propulsion device 110, a second motor 121 corresponds to a second propulsion device 111, a third motor 122 corresponds to a third propulsion device 112, and a fourth motor 123 corresponds to a fourth propulsion device 113.

Each of the motors 120-123 may be coupled to a drive source 130 that includes a controller 131 and a power source 132. The power source 132 may be a battery-powered source that is self-contained and rechargeable. Further, each of the motors 120-123 that drive the propulsion devices 110-113 may be a brushless DC motor that may be driven from a DC power source such as a battery. The controller 131 may be configured to control each brushless DC motor 120-123 with PWM signals. The synchronization of pulses in these PWM signals are described in greater detail below with respect to FIGS. 4-5.

Still referring to FIG. 1, the ROV 100 may typically be an underwater vessel wherein each propulsion device 110-113 is a water-based propeller drive system. Thus, the ROV 100 is configured to be water-tight and submersible. In an alternative embodiment, the ROV 100 may be an aircraft drone capable of flight. Such an aircraft is then configured to be lightweight and aerodynamic with a set of air-based propellers. Yet other embodiments may include a land-based embodiment (e.g., wherein the motors turn wheels) or any hybrid combination thereof.

Figure 2:
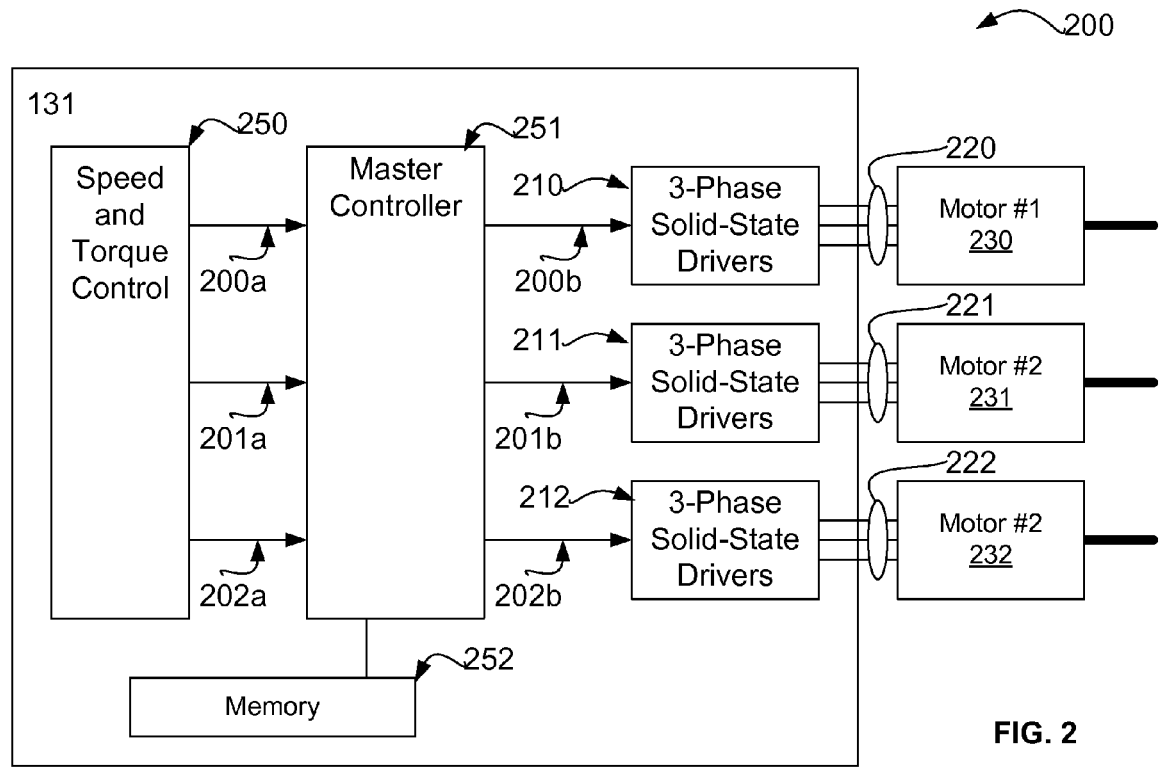
FIG. 2 is a block diagram of an electronic system for controlling several motors, such as the motors of FIG. 1, according to an embodiment of the subject matter disclosed herein.

The ROV 100 may be a small, unmanned vehicle that is compact with many components, devices, and instruments in close proximity to each other. To this end, such an ROV 100 may have particular usefulness in stealth operations, surveillance operations, and other dangerous environment deployments without risking the life of a pilot or operator. As such, the need for the ROV 100 to be stealthy and undetectable is desirable. As the motors 120-123 that drive the propulsion devices 110-113 are engaged and operated, the very nature of brushless DC motors may generate EMI as well as acoustic noise. EMI may be undesirable when in close proximity to sensitive instrumentation and sensors such as may be present within the ROV 100. Further, EMI signatures that may be detected by remote detection equipment in hostile territory may also be undesirable. Further, in an effort to be stealthier, a designer may wish to reduce as much as possible the acoustic noise and signature from the propulsion devices 110-113 as well as from the motors 120-123 driving them. But, as discussed below, both the EMI and acoustic signatures may be reduced or eliminated by driving each motor with synchronized PWM signals as controlled by the controller 131. FIG. 2 shows an embodiment of the controller 131 for accomplishing this goal.

FIG. 2 shows a block diagram of an electronic system 200 for controlling several motors using synchronized pulse signals according to an embodiment of the subject matter disclosed herein. The controller 131 from FIG. 1 is shown with connections to three motors 230, 231, and 232. These motors 230, 231, and 232 may correspond to some or all of the motors as depicted in FIG. 1. It is contemplated that the systems and methods described herein may be implemented with any number of motors and propulsion devices.

In this embodiment, each motor 230-232 includes three windings to be controlled by the controller 131 when driving the motors 230-232. As such a first three-phase connection 220 electrically couples the first motor 230, a second three-phase connection 221 electrically couples the second motor 231, and a third three-phase connection 222 electrically couples the third motor 232. The controller 131 is configured to deliver PWM signals to each winding of each motor 230-232 for controlling the overall movements of the ROV 100 during operation. As is shown below, each PWM signal through the connections 220-222 is configured to be coordinated with every other PWM signal for every winding of each motor so that substantially each rising or falling edge of each pulse substantially corresponds in time with a respective falling or rising edge of another pulse.

The controller 131 includes a speed and torque control subsystem 250 that is configured to receive communication signals (e.g., by remote control) corresponding to movement and then generate drive signals that effectuate such movements. For example, if the ROV 100 is being controlled remotely by a human operator, a communication signal may be sent to move the ROV 100 to the left. The speed and torque control subsystem 250 receives this command and then generates one or more drive signals to engage the proper motors that will causes the ROV 100 to move left. Thus, in the example system as shown with three motors 230-232, the speed and torque control subsystem 250 may generate a signal at the drive connections 200a and 201a (corresponding to engaging motors 230 and 231) but not at the drive connection 202a (corresponding to engaging motor 232).

These drive signals 200a, 201a, and 202a are received by a master controller 251 and consequently manipulated to synchronize the stream of PWM signals to each motor 230-232. The particular manner in which a set of PWM signals are generated and synchronized may be referred to as a synchronization schema. Thus, PWM signals for the first motor 230 are sent as drive signals 200b to a first three-phase solid-state driver 210. The first three-phase solid-state driver 210 then generates corresponding synchronized PWM signals for each phase in the three-phase connection 220 to the first motor 230. Similarly, PWM signals for the second motor 231 are sent as drive signals 201b to a second three-phase solid-state driver 211. The second three-phase solid-state driver 211 then generates corresponding synchronized PWM signals for each phase in the three-phase connection 221 to the second motor 231. Finally, in this embodiment, PWM signals for the third motor 232 are sent as drive signals 202b to a third three-phase solid-state driver 212. The third three-phase solid-state driver 212 then generates corresponding synchronized PWM signals for each phase in the three-phase connection 222 to the third motor 232. Various synchronization schemas may be stored in and retrieved from a coupled memory 252 and are more fully understood and described below with respect to the timing diagrams of FIGS. 4 and 5.

Figure 3:
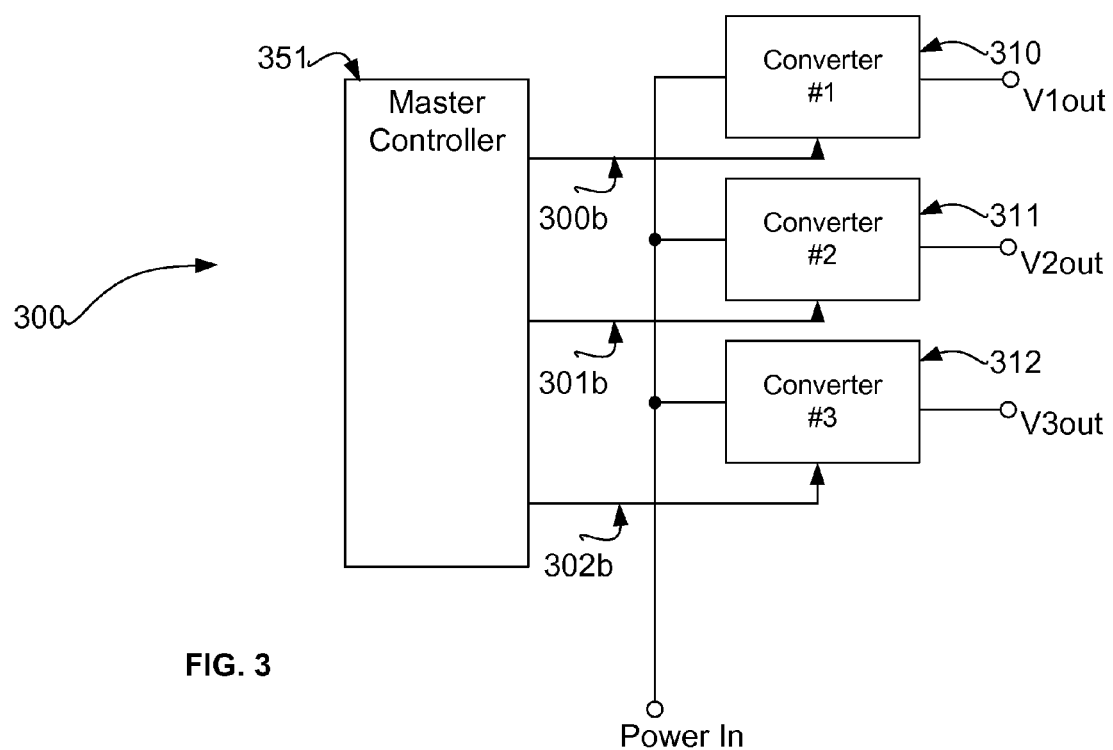
FIG. 3 is a block diagram of an electronic system for controlling one or more switching power supplies according to an embodiment of the subject matter disclosed herein.

FIG. 3 shows a block diagram of an embodiment of an electronic system 300 for controlling one or more power switching supplies according to an embodiment of the subject matter disclosed herein. In this embodiment, there are power converters 310-312 disposed between the master controller 351 and the connection terminals as represented by voltages, V1, V2, and V3). Thus, the PWM signals from the master controller 351 (that also may be synchronized by the master controller 351) may be sent as drive signals 300b, 301b, and 302b to each corresponding power converter 310-312. Each power converter 310-312 may then modify an input power voltage into a desired output power voltage at each respective connection terminal.

For example, in one embodiment, the input power voltage may be 10 Vdc but the desired output power voltage at each connection terminal 310-312 is 5 Vdc. Thus, each power converter 310-312, which may be a DC-to-DC power converter, may be driven by an appropriate PWM signal from the master controller 351 to yield a resultant 5 VDC signal at the connection terminals 310-312. Of course, any switching schema may be employed, such an AC-to-AC schema or an AC-to-DC schema as the situation demands. Further, PWM signals to the power converters may be synchronized by phase (in a case of 3-phase power supplies) or by switching supply (in a case of 3 single-phase power supplies. Again, various synchronization schemas may be stored in and retrieved from a coupled memory 252 and are more fully understood and described below with respect to the timing diagrams of FIGS. 4 and 5.

FIGS. 4A-B shows respective plots of two streams of PWM pulses for driving respective windings of two motors using a synchronization schema according to an embodiment of the subject matter disclosed herein. The master controller 251 from the electronic system 200 of FIG. 2 may generate a repeating sequence of PWM pulses that causes a substantially sinusoidal current (e.g., sinusoidal signal 420) to flow through a motor windings (sinusoidal driving of a brushless-DC motor coil typically provides a relatively smooth (i.e., reduced jitter) rotation of the motor). The frequency of the sinusoidal current signal synthesized by this synchronization schema determines the motor velocity, and in turn, the amount of propulsion that the motor provides. The sinusoidal current signal produced via the PWM pulses is a result of the width of each pulse and the frequency at which the pulse sequence is repeated so as to provide the sinusoidal current signal with the frequency needed to produce the specified motor velocity. Thus, in a steady-state where the velocity of the motor is constant, the pulse stream repeats in a predictable pattern with a period that is proportional to (e.g., the same as) the period of the sinusoidal current signal.

The top plot 401 shows a series of PWM pulses for phase A of a first motor and the lower plot 402 shows a series of PWM pulses for phase A of a second motor. The set of pulses in the top plot 401 yields a winding current 420 that is sinusoidal. The winding current 425 in the lower plot 402 is also sinusoidal, but shifted in phase with respect to the drive signal 420. As is described in greater detail below, each PWM pulse is synchronized (between the top plot 401 referred to as controller channel #1 401 from here on and the lower plot 402 referred to as controller channel #2 402 from here on) to reduce EMI and acoustic noise, such that when any pulse edge occurs, a pulse edge from another series occurs at substantially the same time with the opposite polarity.

Pulses are understood to be signals that do not propagate from a zero magnitude signal to a non-zero magnitude signal. That is, there exists a definite amount of time for a pulse to rise or to fall. Thus, although shown in FIGS. 4 and 5 as substantially vertical, the rising edge and the falling edge of each pulses takes a finite amount of time. As a result, there exists at least some slope in the pulse signal edges. Furthermore, as pulse edges are synchronized, it is also understood that an alignment in time of pulse edges may be precisely synchronized (i.e., the rising pulse begins to rise at exactly the same time as the falling pulse begins to fall). Alternatively, the alignment in time of pulse edges may be slightly offset (i.e., the rising pulse begins to rise at a predetermined time shortly before or after the falling pulse begins to fall). In yet another alternative, the alignment in time of pulse edges may be discretely offset (i.e., the rising pulse begins to rise precisely at the time that the falling pulse ends its fall). Other variations or any combination of such alignments are also contemplated.

For a PWM controlled brushless DC motor in a system with at least two motors, the edges of the pulses used to drive the first motor are synchronized with the opposite edges of pulses used to drive the second motor. In this embodiment, a rising edge is any edge that starts at zero volts and ends at a nonzero voltage, whether positive or negative, and a falling edge is any edge that starts at a nonzero voltage, whether positive or negative, and ends at zero volts. In other embodiments, however, the definitions of rising and falling edges may be different. For example, the falling edge of a first pulse in the controller channel #1 401 is synchronized in time with the rising edge of a first pulse in the channel #2 402. This is represented by dotted line 430. Then, the falling edge of the first pulse generated by controller channel #2 402 is synchronized in time with the rising edge of the second pulse generated by controller channel #1 401. This is represented by dotted line 431. As time progresses, one can see by dotted line representations 432, 433, etc. that each rising edge in controller channel #1 401 corresponds in time to a falling edge in controller channel #2 402 and vice versa. So, effectively, any acoustic noise and EMI generated individually by one pulse edge in controller channel #1 401 is partially or fully cancelled by the acoustic noise and EMI generated individually by the other pulse edge of opposite polarity in controller channel #2 402.

As is known from Fourier analysis, a periodic sequence of PWM pulses may also generate aggregate EMI at harmonics of the sequence period, where a majority of the EMI energy is within a corresponding bandwidth. Thus, another way to reduce the EMI within a specific bandwidth is to spread the EMI harmonics over a wider bandwidth. And one way to spread the EMI harmonics over a wider bandwidth is to vary the period of time over which the sequence of PWM pulses repeats itself.

Thus, in several synchronization schemas, the period at which the pulse sequences in each channel repeat themselves changes, thereby spreading any non-cancelled EMI energy over a wider bandwidth. Because the sinusoidal winding current waveform is known a priori, the master controller 251 may determine in advance the timing of the pulse edges for each phase of each motor, so that the pulse-edge synchronization may be precise. In other embodiments, the synchronization schemas may be stored in look-up table (LUT) such that the master controller 251 need only implement a specific synchronization schema that may correspond to a specific control action (e.g., full speed ahead, impulse speed, etc.). In yet further embodiments, the synchronization schema may be a series of pseudo-randomized pulse sequences that attempt to spread EMI energy out in a less detectable manner.

Still referring to FIGS. 4A-B, a pulse in one or more of series of PWM pulses may become too short (e.g., with respect to time) for the master controller 251 to maintain synchronized pulse edges. That is, as the requirements remain to deliver the correct drive signal to the motor, the synchronization schema may be compromised for the need to keep the motor turning. In a similar manner, the synchronization schema may also be compromised if a pulse width becomes too wide (e.g., with respect to time), such that the time between pulses in the same channel becomes too small. Therefore, when such an untenable pulse occurs, the master controller 251 may initiate a synchronization reset. As a result, the whole synchronization schema simply waits for the next available pulse edge with which to synchronize. Skipping the synchronization of one or more pulse edges is done so at the expense of allowing some acoustic noise and EMI to go unmitigated while the corresponding series of pulses are once again synchronized.

For example, referring to FIGS. 4A-B, the pulse 450 has become too long as measured by $t_{on}$. The falling edge of this pulse should be lined up with the rising edge of pulse 451. Since the master controller 251 generates these pulses it can measure the length in time of these pulses. Thus, in response to a measuring a time that exceeds a predetermined maximum allowable pulse length, the master controller 251 may reset synchronization by skipping alignment for one pulse edge and then generating an edge of the next pulse substantially simultaneously with another edge of another next pulse. Thus, the falling edge of pulse 450 is not aligned with any edge of any other pulse. However, the falling edge of pulse

451 is next aligned with the rising edge of pulse 452. Thus, synchronization has been reset.

The preceding synchronization schemas are described in the context of a system having a first motor and a second motor. Further, each motor may be a brushless DC motor having three phases driven by a three-phase sinusoidal drive signal. Other dual motor synchronization schemas are contemplated. For example, instead of driving each brushless DC motor with a three-phase sinusoidal signal, each motor may be driven with a single-phase sinusoidal signal. In such an embodiment, the synchronization schemas remain similar as a rising edge of a pulse generated by controller channel #1 401 typically corresponds in time to a falling edge of a pulse generated by controller channel #2 402. As can be seen in other embodiments described below with respect to FIGS. 5A-C, the various synchronization schemas may also be implemented using more than two motors.

FIGS. 5A-C shows plots of three streams of pulses for driving three or more motors using a synchronization schema according to an embodiment of the subject matter disclosed herein. In this synchronization schema, a rising edge of a pulse in controller channel #1 501 (i.e., motor #1 phase A) is synchronized to a falling edge of the pulse in controller channel #2 502 (i.e., motor #2 phase A), as designated by dotted line 520. Then, with the falling edge of this same pulse in controller channel #1 501, a rising edge of a pulse in controller channel #3 503 (i.e., motor #3 phase A) is synchronized as designated by dotted line 521. Then, with the falling edge of this pulse in controller channel #3 503, a rising edge of a next pulse in controller channel #2 502 is synchronized as designated by dotted line 522. At dotted line 523, the falling edge of this next pulse in controller channel #2 502 is synchronized with a rising edge of a next pulse in controller channel #1 501, and likewise, the falling edge of this next pulse in controller channel #1 501 is synchronized with a rising edge of a next pulse in controller channel #3 502 as designated by dotted line 524. In this sense, the master controller is limiting the occurrence of a rising edge of any one pulse in one sequence of pulses to only occur only substantially simultaneous to a falling edge of a pulse from a different sequence of pulses and vice versa.

Such a synchronization schema may be repeated indefinitely so long as any rising edge of a pulse in any controller channel is synchronized with a falling edge of a pulse from another controller channel. Again, a rising edge is any edge that starts at zero volts and ends at a nonzero voltage, whether positive or negative, and a falling edge is any edge that starts at a nonzero voltage, whether positive or negative, and ends at zero volts. In other embodiments, however, the definitions of rising and falling edges may be different.

Further, additional synchronization schemas may be implemented. For example, the master controller 251 may synchronize each rising edge of each pulse from controller channel #1 501 with each falling edge of each pulse from controller channel #2 502 and vice versa. Additionally, the master controller 251 may synchronize each rising edge of each pulse from controller channel #3 503 with each falling edge of each pulse from controller channel #4 (not shown) and vice versa. Further yet, the master controller 251 may implement a synchronization schema that is more randomized such that any rising edge in any controller channel is synchronized with a falling edge from another controller channel.

During the transition between any two synchronization schemas, the master controller 251 may implement a transition synchronization schema. For example, the master controller 351 may temporarily suspend generation of the controller channel #2 502 pulses, and temporarily synchronize the rising and falling edges of a pulse on controller channel #1 501 to the falling and rising edges of a pulse on controller channel #3 503 pulse. Subsequently, the master controller 351 may temporarily suspend generation of the controller channel #3 503 pulses, and temporarily synchronize the rising and falling edges of a pulse on controller channel #1 501 to the falling and rising edges of a pulse on controller channel #2 502. Thereafter, the master controller 351 may commence any synchronization schema discussed above, and may periodically transition to other synchronization schemas as needed or desired.

Other embodiments and synchronization schemas are contemplated. For example, a system may exist with a single motor wherein the pulses driving each of three phases are synchronized with each other as discussed above. Further, the controller channels may deliver a series of PWM pulses for driving a device other than a motor. For example, the controller channels may be for driving multiple switching power supplies, or for driving, multiple outputs of a single switching power supply. In addition, although only one phase from each motor is shown as being pulse edge synchronized to a corresponding phase of another motor, the remaining phases of each motor (e.g., two remaining phases for a total of three phases per motor) may be synchronized to corresponding phases of the other motors in a similar manner.

Still referring to FIGS. 5A-C, a pulse in one or more of series of PWM pulses may become too short for the master controller to generate. That is, as the requirements remain to deliver the correct drive signal to the motor, the synchronization schema may be compromised for the need to keep the motor turning. In a similar manner, the synchronization schema may also be compromised if a pulse width becomes too wide, such that the time between pulses in the same channel becomes too small. Therefore, before such an untenable pulse occurs, the master controller may initiate a synchronization reset. As a result, the whole synchronization schema simply waits for the next available pulse edge with which to synchronize. Skipping the synchronization of one or more pulse edges is done so at the expense of allowing some acoustic noise and EMI to go unmitigated while the corresponding series of pulses are once again synchronized.

For example, referring to FIGS. 5A-C, the pulse 560 has become too short. The falling edge of this pulse should be lined up with the rising edge of pulse some other pulse. Since the master controller 251 generates these pulses it can measure the length in time of these pulses. Thus, in response to a measuring a time that is less than a predetermined minimum allowable pulse length, the master controller 251 may reset synchronization by skipping alignment for one or more pulse edge and then generating an edge of the next pulse substantially simultaneously with another edge of another next pulse. Thus, the falling edge of pulse 560 is not aligned with any edge of any other pulse. Likewise the rising edge of pulse 561 is also not aligned with any other pulse. However, the falling edge of pulse 561 is next aligned with the rising edge of pulse 562. Thus, synchronization has been reset.

While the subject matter discussed herein is susceptible to various modifications and alternative constructions, certain illustrated embodiments thereof are shown in the drawings and have been described above in detail. Furthermore, those skilled in the art will understand that various aspects described in less than all of the embodiments may, nevertheless, be present in any embodiment. It should be understood, however, that there is no intention to limit the subject matter disclosed herein to the specific forms disclosed, but on the contrary, the intention is to cover all modifications, alternative constructions, and equivalents falling within the spirit and scope of the subject matter.

What is claimed is:

1. A circuit, comprising:
a first driver operable to generate an edge of a first pulse, the edge of the first pulse having a polarity;
a second driver operable to generate an edge of a second pulse; the edge of the second pulse having a polarity; and
a third driver operable to generate an edge of a third pulse; the edge of the third pulse having a polarity;
wherein any one of the edges is generated substantially simultaneously with the edge of any one of the other edges, the two substantially simultaneous edges having opposite polarities; and
wherein the edge of the first pulse corresponds to a rising edge of the first pulse and the edge of the second pulse corresponds to a falling edge of the second pulse.

2. The circuit of claim 1, wherein the third driver is operable to generate an edge of a third pulse substantially simultaneously with the edge of the second pulse, the edge of the third pulse having a polarity opposite to the polarity of the edge of the second pulse.

3. The circuit of claim 2, further comprising a fourth driver operable to generate an edge of a fourth pulse substantially simultaneously with the edge of the third pulse, the edge of the fourth pulse having a polarity opposite to the polarity of the edge of the third pulse.

4. A circuit, comprising:
a first driver operable to generate an edge of a first pulse, the edge of the first pulse having a polarity;
a second driver operable to generate an edge of a second pulse; the edge of the second pulse having a polarity; and
a third driver operable to generate an edge of a third pulse; the edge of the third pulse having a polarity,
wherein any one of the edges is generated substantially simultaneously with the edge of any one of the other edges, the two substantially simultaneous edges having opposite polarities; and
wherein the third driver is operable to generate an edge of a third pulse that is not substantially simultaneous with the edge of any other pulse; and
in response, the circuit operable to reset synchronization by:
generating an edge of a fourth pulse with the first driver, the edge of the fourth pulse having a polarity; and
generating an edge of a fifth pulse with the second driver substantially simultaneously with the edge of the fourth pulse, the edge of the fifth pulse having a polarity opposite to the polarity of the edge of the fourth pulse.

5. A circuit, comprising:
a first driver operable to generate an edge of a first pulse, the edge having a polarity; and
a second driver operable to generate an edge of a second pulse substantially simultaneously with the edge of the first pulse, the edge of the second pulse having a polarity opposite to the polarity of the edge of the first pulse;
the circuit further operable to measure a length in time of the first or second pulse; and
in response to a measuring a time that exceeds a predetermined maximum allowable pulse length, the circuit operable to reset synchronization by:
generating an edge of a fourth pulse with the first driver, the edge of the fourth pulse having a polarity; and
generating an edge of a fifth pulse with the second driver substantially simultaneously with the edge of the fourth pulse, the edge of the fifth pulse having a polarity opposite to the polarity of the edge of the fourth pulse.

6. A circuit, comprising:
a first driver operable to generate an edge of a first pulse, the edge having a polarity; and
a second driver operable to generate an edge of a second pulse substantially simultaneously with the edge of the first pulse, the edge of the second pulse having a polarity opposite to the polarity of the edge of the first pulse;
the circuit further operable to measure a length in time of the first or second pulse; and
in response to a measuring a length of time that is less than a predetermined minimum allowable pulse length, the circuit operable to reset synchronization by:
generating an edge of a fourth pulse with the first driver, the edge of the fourth pulse having a polarity; and
generating an edge of a fifth pulse with the second driver substantially simultaneously with the edge of the fourth pulse, the edge of the fifth pulse having a polarity opposite to the polarity of the edge of the fourth pulse.

7. The circuit of claim 6, wherein the first driver is further operable to drive a first phase of a first device with the first pulse; and
wherein the second driver is further operable to drive a first phase of a second device with the second pulse.

8. A method, comprising:
generating a first sequence of pulses for driving a first phase of a device each pulse in the first sequence having edges of first and second polarities; and
generating a second sequence of pulses for driving a phase different from the first phase each pulse in the second sequence having edges of the first and second polarities such that the edges of the pulses in the second sequence having the first polarity occur substantially simultaneously with the edges of the pulses in the first sequence having the second polarity;
the method further comprising:
measuring the length in time of each pulse;
determining if any pulse exceeds a predetermined maximum length or is less than a predetermined minimum length;
in response, generating an edge of a pulse in one of the sequences that does not occur substantially simultaneously with any other edge of any pulse in any sequence; and
resuming generating a third sequence of pulses each having edges of first and second polarities; and
resuming generating a fourth sequence of pulses each having edges of the first and second polarities such that the edges of the pulses in the fourth sequence having the first polarity occur substantially simultaneously with the edges of the pulses of the third sequence having the second polarity.

9. The method of claim 8, wherein generating the second sequence of pulses comprises generating the pulses such that the edges of the pulses having the second polarity occur substantially simultaneously with the edges of the pulses in the first sequence having the first polarity.

10. The method of claim 8, further comprising:
driving a first device with the first sequence of pulses; and
driving a second device with the second sequence of pulses.

11. The method of claim 8, further comprising:
driving a first phase of a first device with the first sequence of pulses; and driving a second phase of the first device with the second sequence of pulses.

12. The method of claim 11, further comprising driving each device according to a predetermined sequence of pulses suitable for delivering a drive signal operable to drive a pulse-width modulated motor at a specific frequency.

13. The method of claim 10 wherein driving the first and second devices comprises driving a first and second pulse-width-modulated power supply.

14. A method, comprising:
generating a first sequence of pulses for driving a first phase of a device each pulse in the first sequence having edges of first and second polarities; and
generating a second sequence of pulses for driving a phase different from the first phase each pulse in the second sequence having edges of the first and second polarities such that the edges of the pulses in the second sequence having the first polarity occur substantially simultaneously with the edges of the pulses in the first sequence having the second polarity;
the method further comprising:
measuring the length in time of each pulse;
determining if any pulse exceeds a predetermined maximum length or is less than a predetermined minimum length;
in response, generating an edge of a pulse in one of the sequences that does not occur substantially simultaneously with any other edge of any pulse in any sequence; and
resuming generating a third sequence of pulses each having edges of first and second polarities; and
resuming generating a fourth sequence of pulses each having edges of the first and second polarities such that the edges of the pulses in the fourth sequence having the first polarity occur substantially simultaneously with the edges of the pulses of the third sequence having the second polarity.

15. A method, comprising:
generating, with a first driver, a sequence of first pulses each having edges of first and second polarities;
generating, with a second driver, a sequence of second pulses each having edges of the first and second polarities;
generating, with a third driver, a sequence of third pulses each having edges of the first and second polarities;
each edge of each pulse in each sequence having the first polarity occurring substantially simultaneously with at least one edge of at least one other pulse having the second polarity;
the method further comprising:
measuring the length in time of each pulse;
determining if any pulse exceeds a predetermined maximum length or is less than a predetermined minimum length;
in response, generating an edge of a pulse in one of the sequences that does not occur substantially simultaneously with any other edge of any pulse in any sequence; and
resuming generating a fourth sequence of pulses each having edges of the first and second polarities such that the edges of the pulses in the fourth sequence having the first polarity occur substantially simultaneously with the edges of the pulses of the third sequence having the second polarity.

16. A method for driving a plurality of at least three devices, the method comprising:
driving each device with a series of pulses, each pulse in each series having an edge with a first polarity and an edge with a second polarity; and
limiting the occurrence of edges with the first polarity in one series to only occur substantially simultaneous to edges with the second polarity from a different series of pulses polarity;
the method further comprising:
measuring the length in time of each pulse;
determining if any pulse exceeds a predetermined maximum length or is less than a predetermined minimum length;
in response, generating an edge of a pulse in one of the sequences that does not occur substantially simultaneously with any other edge of any pulse in any sequence.

* * * * *